United States Patent
Lin et al.

(10) Patent No.: US 9,178,015 B2
(45) Date of Patent: Nov. 3, 2015

(54) TRENCH MOS DEVICE HAVING A TERMINATION STRUCTURE WITH MULTIPLE FIELD-RELAXATION TRENCHES FOR HIGH VOLTAGE APPLICATIONS

(71) Applicant: Vishay General Semiconductor LLC, Hauppauge, NY (US)

(72) Inventors: Yi-Yu Lin, New Taipei (TW); Chun-Chueh Chang, Yilan County (TW); Pu Ju Kung, New Taipei (TW)

(73) Assignee: Vishay General Semiconductor LLC, Hauppauge, NY (US)

( * ) Notice: Subject to any disclaimer, the term of this patent is extended or adjusted under 35 U.S.C. 154(b) by 60 days.

(21) Appl. No.: 14/152,564

(22) Filed: Jan. 10, 2014

(65) Prior Publication Data

US 2015/0200250 A1    Jul. 16, 2015

(51) Int. Cl.
| | |
|---|---|
| *H01L 29/66* | (2006.01) |
| *H01L 29/06* | (2006.01) |
| *H01L 29/872* | (2006.01) |
| *H01L 29/40* | (2006.01) |

(52) U.S. Cl.
CPC ........ *H01L 29/0634* (2013.01); *H01L 29/0661* (2013.01); *H01L 29/407* (2013.01); *H01L 29/66143* (2013.01); *H01L 29/8725* (2013.01)

(58) Field of Classification Search
CPC ..................... H01L 29/8725; H01L 29/66143; H01L 29/0661; H01L 29/7397; H01L 29/7811; H01L 29/7813; H01L 29/0634
USPC .......... 257/330, 329, 328, 341, 335, E29.256, 257/E27.06, E21.41; 438/268, 270, 589
See application file for complete search history.

(56) References Cited

U.S. PATENT DOCUMENTS

| | | | |
|---|---|---|---|
| 6,855,986 B2* | 2/2005 | Hsieh et al. | 257/339 |
| 6,900,523 B2* | 5/2005 | Qu | 257/618 |
| 8,519,477 B2* | 8/2013 | Hsieh | 257/330 |
| 8,680,613 B2* | 3/2014 | Guan et al. | 257/333 |
| 2003/0042556 A1* | 3/2003 | Gajda et al. | 257/401 |
| 2008/0035993 A1* | 2/2008 | Cao et al. | 257/333 |
| 2009/0057756 A1* | 3/2009 | Hshieh | 257/330 |
| 2009/0090967 A1* | 4/2009 | Chen et al. | 257/330 |
| 2010/0289059 A1* | 11/2010 | Hsieh | 257/140 |
| 2011/0108911 A1 | 5/2011 | Matsuoka | |
| 2011/0227152 A1 | 9/2011 | Hsu et al. | |

(Continued)

FOREIGN PATENT DOCUMENTS

KR    10-2013-0014844 A    2/2013

*Primary Examiner* — Cuong Q Nguyen
*Assistant Examiner* — Yosef Gebreyesus
(74) *Attorney, Agent, or Firm* — Stuart H. Mayer; Mayer & Williams PC (57) ABSTRACT

A termination structure for a semiconductor device includes a semiconductor substrate having an active region and a termination region. Two or more trench cells are located in the termination region and extend from a boundary of the active region toward an edge of the semiconductor substrate. A termination trench is formed in the termination region on a side of the trench cells remote from the active region. A conductive spacer is located adjacent to a sidewall of the termination trench nearest the trench cells. A first oxide layer is formed in the termination trench and contacts a sidewall of the conductive spacer. A first conductive layer is formed on a backside surface of the semiconductor substrate. A second conductive layer is formed atop the active region and the termination region.

18 Claims, 8 Drawing Sheets

(56) References Cited

U.S. PATENT DOCUMENTS

| | | | |
|---|---|---|---|
| 2011/0254070 A1* | 10/2011 | Hsieh | 257/315 |
| 2011/0316075 A1* | 12/2011 | Hsieh | 257/330 |
| 2012/0187473 A1 | 7/2012 | Zeng et al. | |
| 2013/0207172 A1 | 8/2013 | Hsieh | |
| 2014/0291753 A1* | 10/2014 | Hsieh | 257/330 |

* cited by examiner

FIG. 1

PRIOR ART

TRENCH MOS DEVICE HAVING A TERMINATION STRUCTURE WITH MULTIPLE FIELD-RELAXATION TRENCHES FOR HIGH VOLTAGE APPLICATIONS

FIELD OF THE INVENTION

The present invention relates generally to a semiconductor device, and more particularly to a termination structure for a trench MOS device.

BACKGROUND

Conventionally, a Schottky diode includes a heavily-doped semiconductor substrate, typically made of single-crystal silicon. A second layer covers the substrate. The second layer, called the drift region, is less heavily-doped with impurities having carriers of the same conducting type as the substrate. A metal layer or a metal silicide layer forms a Schottky contact with the lightly-doped drift region and forms the diode anode.

Two opposing constraints arise when forming a unipolar component such as a Schottky diode. In particular, the components should exhibit the lowest possible on-state resistance (Ron) while having a high breakdown voltage. Minimizing the on-state resistance imposes minimizing the thickness of the less doped layer and maximizing the doping of this layer. Conversely, to obtain a high reverse breakdown voltage, the doping of the less doped layer must be minimized and its thickness must be maximized, while avoiding the creation of areas in which the equipotential surfaces are strongly bent.

Various solutions have been provided to reconcile these opposite constraints, which has led to the development of trench MOS-capacitance Schottky diode structures, which are referred to as Trench MOS Barrier Schottky (TMBS) diodes. In an example of such devices, trench regions are formed in the upper portion of a thick drift layer that is less heavily doped with impurities of the same conductivity type than the underlying substrate. The trench regions are filled with a MOS structure. An anode metal layer is evaporated to cover the entire surface and forms a Schottky contact with the underlying drift region.

When reverse biased, the insulated conductive areas cause a lateral depletion of charge into the drift region, which modifies the distribution of the equipotential surfaces in this layer. This enables increasing the drift region doping, and thus reducing the on-state resistance with no adverse effect on the reverse breakdown voltage.

A key issue for achieving a high voltage Schottky rectifier is the design of its termination region. As with any voltage design, the termination region is prone to higher electric fields due to the absence of self multi-cell protection and the curvature effect. As a result, the breakdown voltage is typically dramatically reduced from its ideal value. To avoid this reduction, the termination region should be designed to reduce the crowding of the electric field at the edge of the device (near the active region). Conventional approaches to reduce electric field crowding include termination structures with local oxidation of silicon (LOCOS) regions, field plates, guard rings, trenches and various combinations thereof. One example of a Schottky diode that includes such a termination region is shown in U.S. Pat. No. 6,396,090.

Figure 1:
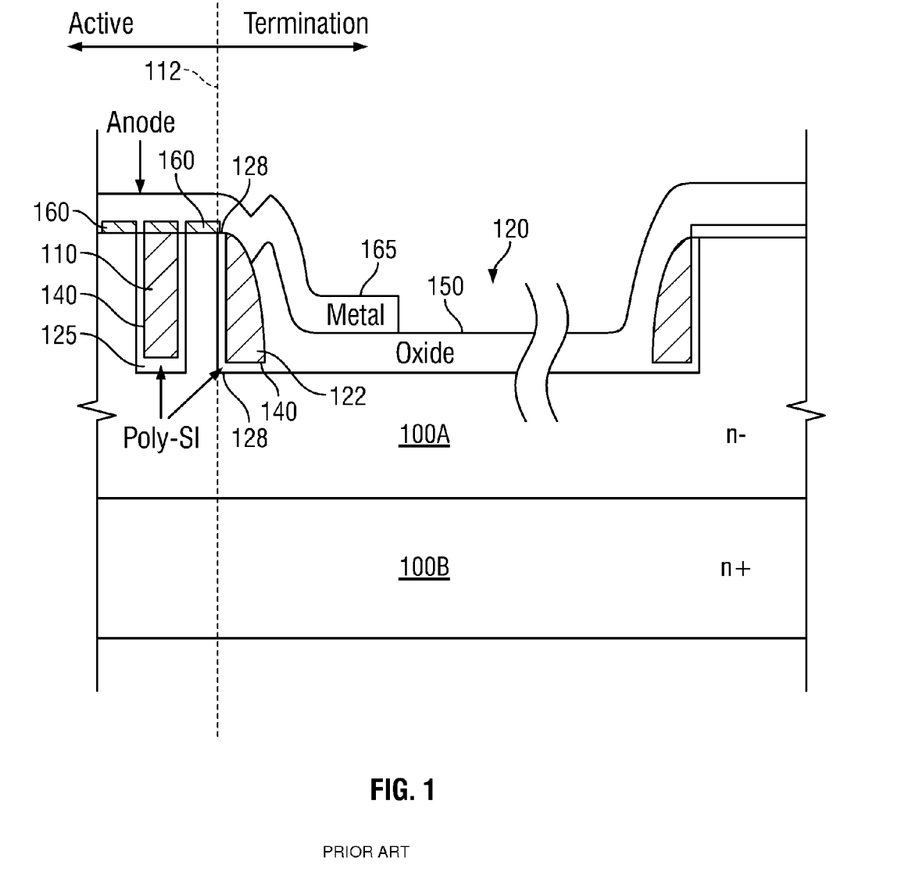
FIG. 1 is a simplified, partial view of a conventional TMBS diode or rectifier.

FIG. 1 shows a simplified, cross-sectional view of the active and termination regions of a TMBS Schottky diode of the type shown in U.S. patent application Ser. No. 12/724,771. The active region includes a semiconductor substrate 100B that is heavily doped with a dopant of a first conductivity type (e.g., n+ type). A first layer 100A is formed on the substrate 100B and is more lightly doped with a dopant of the first conductivity type (e.g., n− type). Trenches 110 (only one of which is shown) are formed in the first layer 100A. The trenches 110 are lined with an insulating layer 125 and filled with a conductive material 140 such as doped polysilicon. A metal layer 165 is formed over the exposed surfaces of the conductive material 140 and the first layer 100A, thereby forming a Schottky contact 160 at the interface between the metal layer 165 and the first layer 100A. A cathode electrode (not shown) is located on the backside of the semiconductor substrate 100B.

The termination region of the TMBS diode shown in FIG. 1 includes a termination trench 120 that extends from the boundary 112 with the active region toward an edge of the semiconductor substrate 100B. A MOS gate 122 is formed on a sidewall of the termination region adjacent to the boundary 112 with the active region. The MOS gate includes an insulating material 128 and a conductive spacer 122. The insulating material 128 lines the sidewall against which the conductive spacer 122 is located and the portion of the first layer 100A adjacent to the sidewall. The conductive spacer 122 covers the insulating material 128. A termination oxide layer 150 is formed in the termination trench 120 and extends from the conductive spacer 122 toward the edge of the device. The metal layer 165 located in the active region extends into the termination region and covers the conductive spacer 122 and a portion of the termination oxide layer 150 to thereby define a field plate.

Unfortunately, for high voltage applications these conventional designs for the termination region have had only limited success because the electric field distribution at the surface of the termination region is still far from ideal. Because of the limited length of the drift region, the electric field rises rapidly at the end of active region due to the asymmetry. As a result the breakdown of the device is dominated by edge breakdown.

The conventional device shown in FIG. 1 has been driven to 200V, but at this point its performance is already degrading because of the premature breakdown at the surface of the termination region. Consequently the reliability of this design largely depends on the end position of the field plate 165 in the termination regions. Normally, the metal wet etching process used in the formation of the field plate 165 can only be controlled to a precision within about ±6 μm, and this variability can have a significant impact on the device's reverse blocking voltage. For instance, a short field plate will exaggerate the electric field near the corner of the last active cell, resulting in premature breakdown. On the other hand, a longer field plate that extends to a point near the remote spacer can degrade the breakdown voltage as well, while also causing mechanical stress at its elongated metal end.

TABLE 1

Breakdown voltage vs. metal field plate length of conventional TMBS termination

| | Extended Metal Length Variation (μm) | | | | | | |
|---|---|---|---|---|---|---|---|
| | −4 | −2 | 0 | +2 | +4 | +6 | +8 |
| Breakdown Voltage, $V_{br}$ (V) | 235 | 277 | 278 | 276 | 271 | 269 | 261 |
| Breakdown Fluctuation (%) | −15.5 | −0.72 | — | −0.72 | −2.52 | −3.24 | −6.14 |

Table 1 shows the variation in breakdown voltage as a function of the length of the metal field plate. The data were obtained from a simulation of a drift layer designed for high breakdown voltage TMBS devices with a 20 μm termination trench. It should be noted that the breakdown voltage of the unit cell with the same parameters of the drift region is 375V, and, as the Table shows, the highest breakdown voltage achievable with the conventional termination design is 74% of the ideal value.

SUMMARY OF THE INVENTION

A termination structure for a semiconductor device is disclosed. The termination structure includes a semiconductor substrate having an active region and a termination region. Two or more trench cells are located in the termination region and extend from a boundary of the active region toward an edge of the semiconductor substrate. A termination trench is formed in the termination region on a side of the trench cells remote from the active region. A conductive spacer is located adjacent to a sidewall of the termination trench nearest the trench cells. A first oxide layer is formed in the termination trench and contacts a sidewall of the conductive spacer. A first conductive layer is formed on a backside surface of the semiconductor substrate. A second conductive layer is formed atop the active region and the termination region.

A method of forming a semiconductor device is also disclosed. In accordance with the method, at least one trench MOS device is formed which is located in an active region of a semiconductor substrate. Two or more trench cells are formed, which are located in a termination region of the semiconductor substrate adjacent to the active region of the semiconductor substrate. The trench cells extend from a boundary between the active and termination regions toward an edge of the semiconductor substrate. A termination trench is formed in the termination region of the semiconductor substrate on a side of the trench cells remote from the active region. A conductive spacer is formed, which is located adjacent a sidewall of the termination trench nearest the trench cells. A first oxide layer is formed in the termination trench which contacts a sidewall of the conductive spacer. A first conductive layer is formed on a backside surface of the semiconductor substrate. A second conductive layer is located atop the active region. A field plate is formed in the termination region

DETAILED DESCRIPTION

As detailed below, a termination structure is provided which reduces the aforementioned problems. The structure includes two or more trench cells as well as a termination trench that extends beyond the termination trench. The termination structure trenches serve as field-relaxation rings to enhance the breakdown voltage of the device. An extended metal field plate covers both the trench cells and the termination trench. Such a termination structure can extend the boundary of the electric field profiles while additional trench cells can further reduce the impact on the electric field distribution which arises from variations in the length of the field plate. Simulation results will be presented showing the influence of the termination structure on the breakdown voltage.

Figure 2:
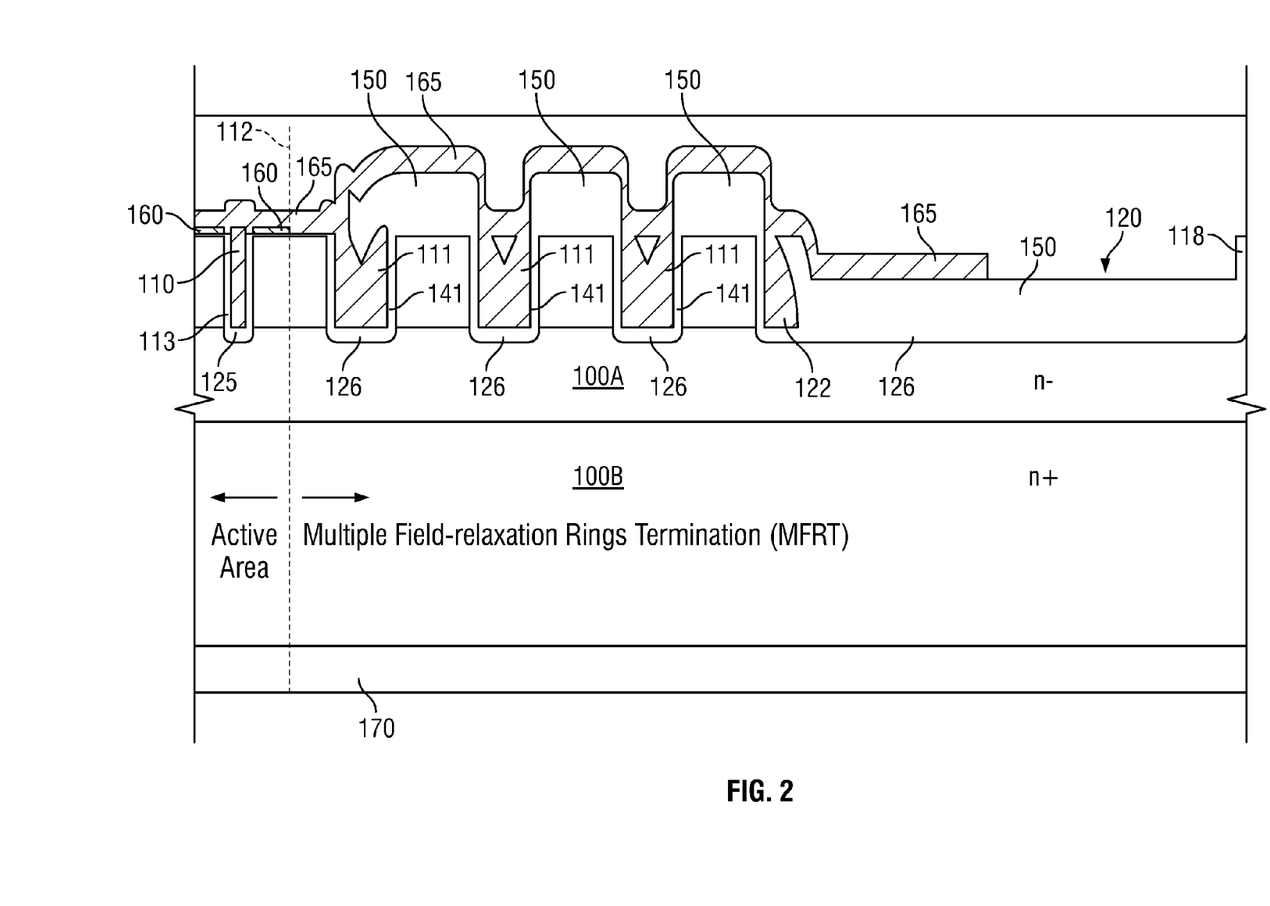
FIG. 2 shows a cross-sectional view of the active and termination regions of one example of a TMBS diode constructed in accordance with the present invention.

FIG. 2 shows a cross-sectional view of the active and termination regions of a TMBS Schottky diode constructed in accordance with one example of the present invention. The active region includes a semiconductor substrate 100B that is heavily doped with a dopant of a first conductivity type (e.g., n+ type). A first layer 100A is formed on the substrate 100B and is more lightly doped with a dopant of the first conductivity type (e.g., n– type). Trenches 110 (only one of which is shown) are formed in the first layer 100A. The trenches 110 are lined with an insulating layer 125 and filled with a conductive material 113 such as doped polysilicon or a metal such as Al. A metal layer 165 is formed over the exposed surfaces of the conductive material 113 and the first layer 100A, thereby forming a Schottky contact 160 at the interface between the zmetal layer 165 and the first layer 100A. A cathode electrode 170 is located on the backside of the semiconductor substrate 100B.

The termination structure of the TMBS Schottky diode shown in FIG. 2, referred to herein as a Multiple Field-Relaxation Trench (MFRT) structure, includes one or more trench cells 111 that begin at the boundary 112 with the active region and extends toward an edge of the semiconductor substrate 100B. In this example three such trench cells 111 are shown. Beyond the trench cells 111, closer to the edge of the substrate 100B, is a termination trench 120 that is also part of the termination region.

The trench cells 111 and the termination trench 120 are lined with an insulating layer 126 and filled with a conductive material 141 such as doped polysilicon or a metal such as Al. A conductive spacer 122 is formed on a sidewall of the termination trench 120 nearest the trench cells 111. The insulating material 126 lines the sidewall against which the conductive spacer 122 is located and the portion of the first layer 100A adjacent to the sidewall.

A termination oxide layer 150 is formed in the termination trench 120 on the insulating material 126. The termination oxide layer 150 extends from the conductive spacer 122 toward the edge of the device and over the remote sidewall 118 of the termination trench 120. The termination oxide layer 150 also covers the surface of the first layer 100A located between the trench cells 111 and between the trench cells 111 and the termination trench 120. The metal layer 165 located in the active region extends into the termination region and covers the trench cells 111 and the portions of the oxide layer 150 located therebetween. The metal layer 150 extends into the termination trench 120, covering the conductive spacer 122 and a portion of the oxide layer 120 located in the termination trench 150. The metal layer 165, which serves as a field plate, may terminate before reaching the remote sidewall 118 of the termination trench 120.

Figure 3:
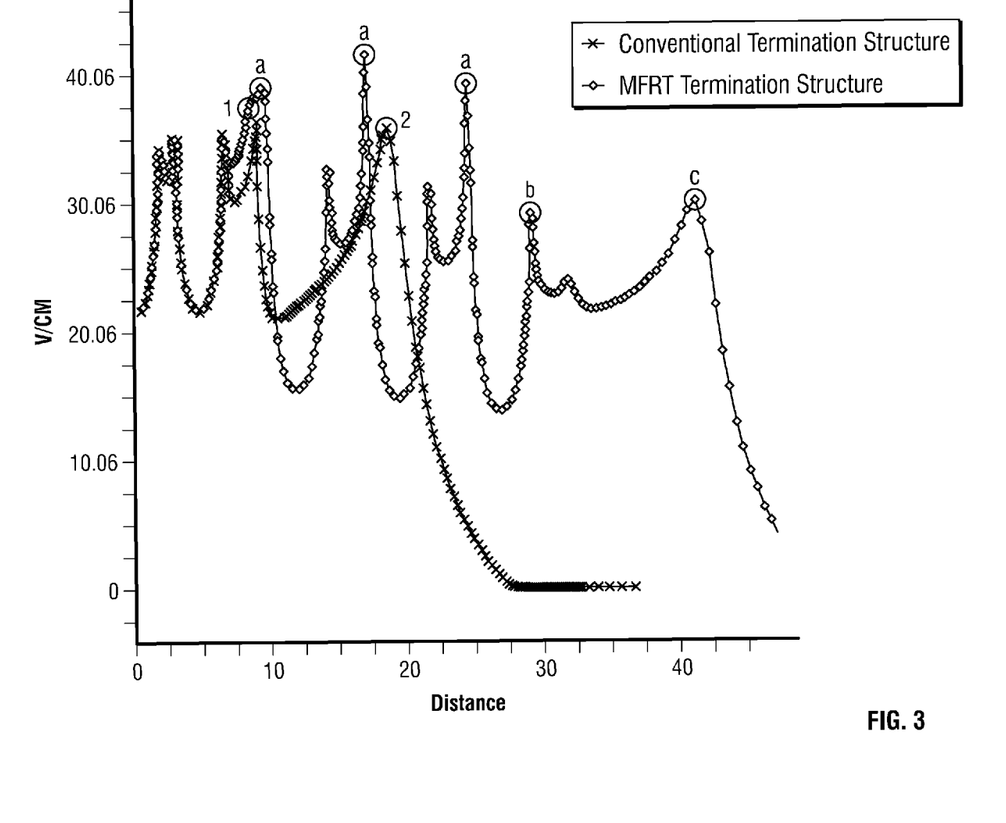
FIG. 3 illustrates the electric field at various locations under the termination regions of the conventional device shown in FIG. 1 and the device shown in FIG. 2 for a field plate 12 microns in length.

FIG. 3 illustrates the electric field at various locations under the termination regions of the conventional device shown in FIG. 1 and the device shown in FIG. 2. The length of the field plate in both cases is 12 microns and the reverse bias is 200V. The electric fields were determined by computer simulation. Five points are denoted in FIG. 3, each representing a different location, which are as follows:

Point 1 represents the maximum electric field under the polymer spacer of a conventional TMBS device such as shown in FIG. 1.

Point 2 represents the maximum electric field under the terminal end of the field plate of a conventional TMBS device such as shown in FIG. 1.

Point a represents the maximum electric field under the trench cells of the TMBS device shown in FIG. 2 having an MFRT termination structure.

Point b represents the maximum electric field under the conductive spacer of the TMBS device shown in FIG. 2 having an MFRT termination structure.

Point 3 represents the maximum electric field under the terminal end of the field plate of the TMBS device shown in FIG. 2 having an MFRT termination structure.

Figure 4:
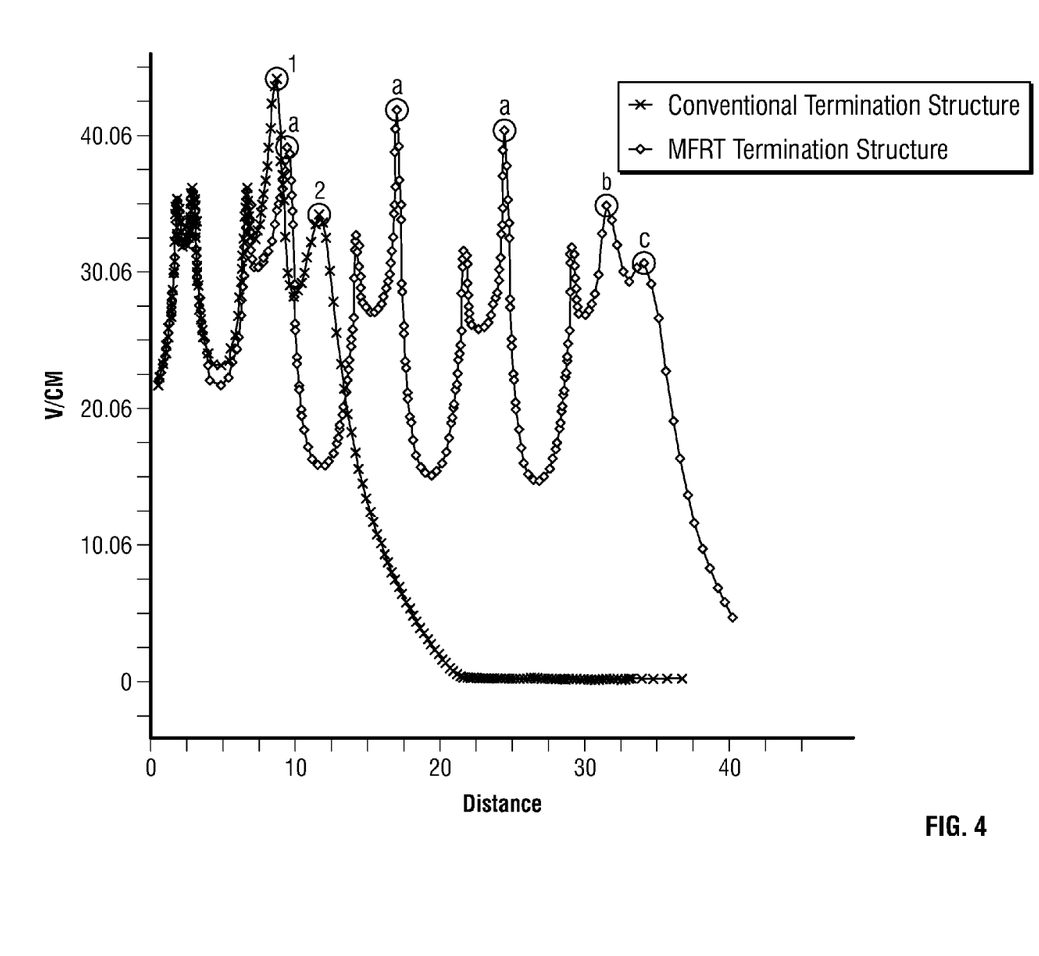
FIG. 4 illustrates the electric field at various locations under the termination regions of the conventional device shown in FIG. 1 and the device shown in FIG. 2 for a field plate 5 microns in length.

Similar to FIG. 3, FIG. 4 illustrates the electric field at various locations under the termination structure of the conventional device shown in FIG. 1 and the device shown in FIG. 2. However, in this example the length of the field plate is 5 microns.

The results shown in FIGS. 3 and 4 indicate that a major difference between the conventional device and the device shown in FIG. 2 is the value of the electric field under the conductive spacer and the terminal end of the field plate. The maximum electric field under the conventional TMBS device occurs under the conductive spacer, particularly when the length of the field plate is 5 microns. On the other hand, the maximum electric field under the TMBS device shown in FIG. 2 occurs under the bottom of the trench cells when the length of the field plate is 5 microns. Although the maximum electric field in both the conventional device and the device shown in FIG. 2 is as high as $4 \times a 10^5$ V/cm, in the latter TMBS device the termination region may not impact the breakdown voltage of the device due to the lack of a conductive path on the mesas located between the trench cells.

When the length of the field plate is 12 microns, the device shown in FIG. 2 can increase the breakdown voltage from 212V to 226V. When the length of the field plate is 5 microns, the device shown in FIG. 2 can still keep the breakdown voltage at about 225V, but the breakdown voltage in the conventional device is reduced to 170V.

One important advantage of the structure shown in FIG. 2 is that its fabrication does not require any additional processing steps beyond those used to fabricate the conventional TMBS device shown in FIG. 1. Compared to traditional edge termination technology, no additional control of the diffusion processes or complex multi-field plate settings are required. For instance, the trenches for the guard rings can be formed simultaneously with trenches in the active region. In addition, the insulating layers 125 and 126 can be formed simultaneously with one another and the conductive material 140 and 141 can be deposited simultaneously with one another.

One example of a method that may be employed to form the TMBS diode of FIG. 2 will be described with reference to FIGS. 5-8. In this example the Schottky diode and its termination structure are formed simultaneously, though this need not always be the case.

Figure 5:
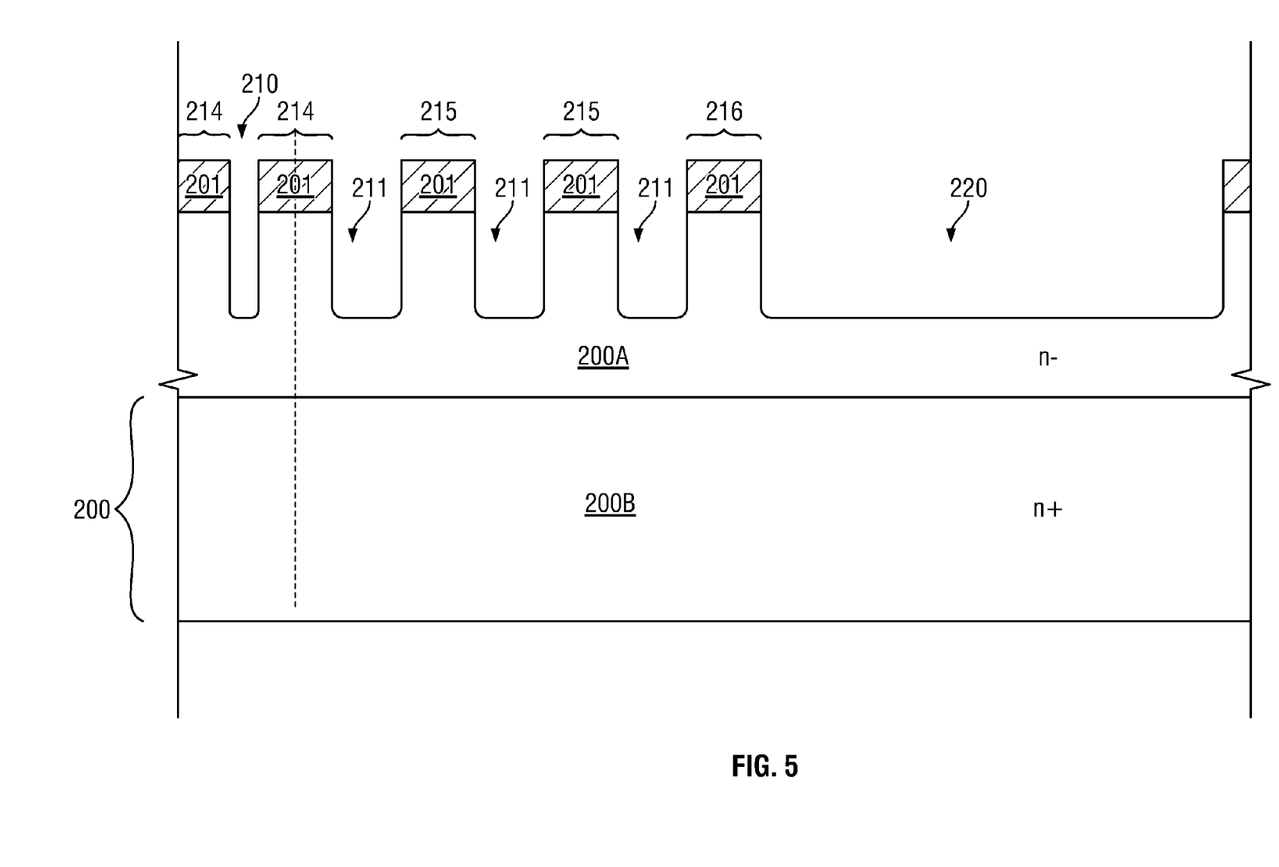
FIGS. 5-8 illustrate one example of the process steps that may be employed to fabricate the device of FIG. 2.

FIG. 5 is a cross-sectional view of a semiconductor substrate 200 that includes a first layer 200A having a dopant of a first conductivity type (e.g., n− type) and a base substrate 200B which is more heavily doped with a dopant of the first conductivity type (e.g., n+ type). An oxide layer 201 is formed on the first substrate 200A by chemical vapor deposition (CVD), for example, to a thickness of about 2000-10,000 angstroms. Next, a photoresist (not shown) is coated on the oxide layer 201 to define one or more active region trenches 210 in the active region, a plurality of trench cells 211 in the termination region and a termination trench 220 also in the termination region. In this example three trench cells 211 are shown, though one of ordinary skill will recognize that the same process may be used to form a device with any number of trench cells. The trench cells 211 are spaced apart from one another by mesas 215 and the trench cells 211 are separated from the termination trench 220 by mesa 216. In addition, mesas 214 separate the active cells 210 from one another and the trench cell 211 and the active cell 210 which are adjacent to one another. In one example each of the active region trenches 210 is about 0.2-2.0 microns in width. In one example the termination trench 220 has a width of 12 μm and the guard rings trenches have a width of 0.5 μm.

Figure 6:
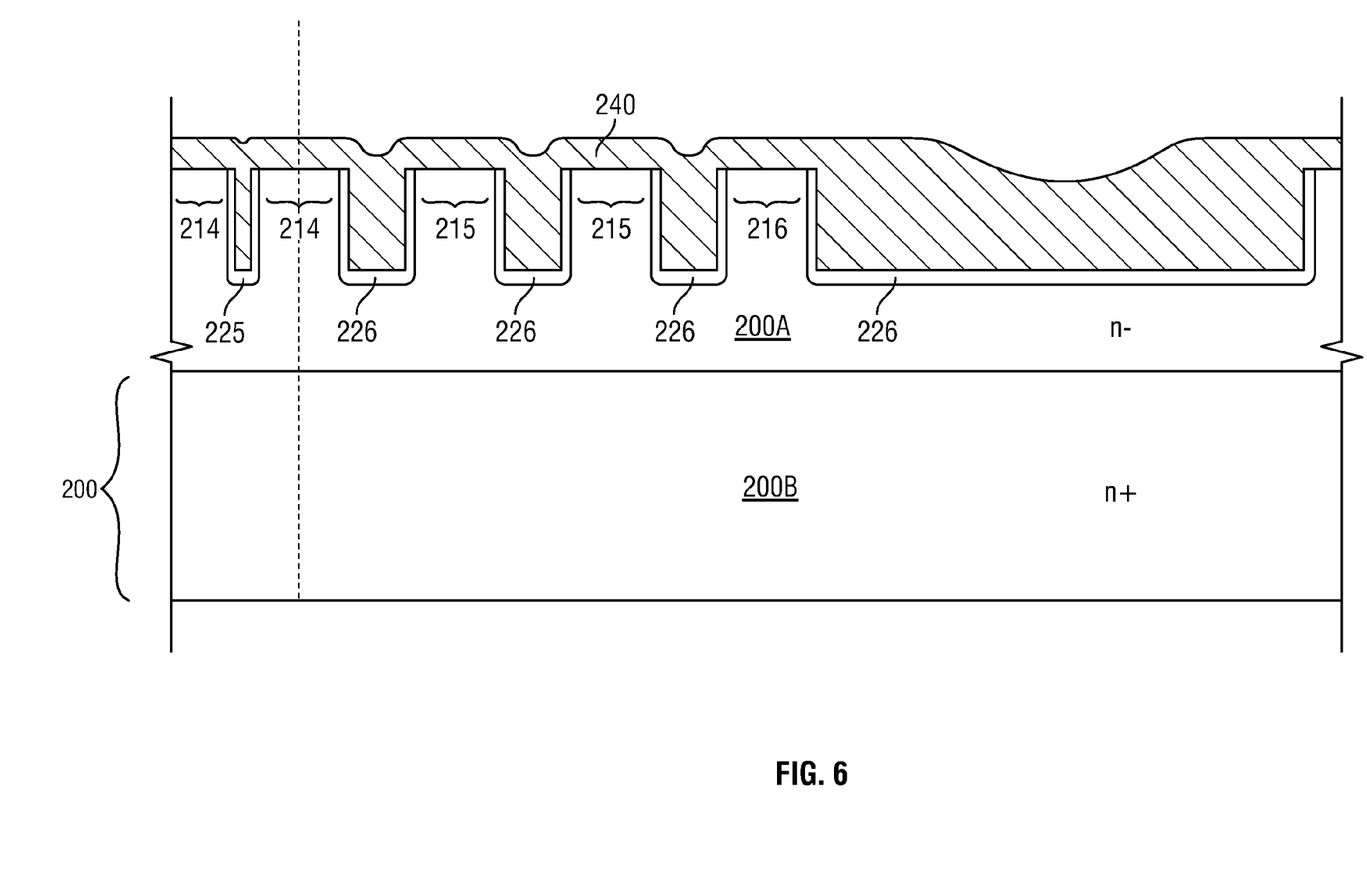

Referring to FIG. 6 after removal of the oxide layer 201, a high temperature oxidation process is performed to form gate oxide layer 225 and termination oxide layer 226. The oxide layers 225 and 226, which in some examples has a thickness between about 150 angstroms and 3000 angstroms, is formed on the sidewalls and bottoms of the active trench 210, trench cells 211 and the termination trench 220. The oxide layers 225 and 226 lining all the various trenches may be formed simultaneously in a single process. Instead of an oxidation process, the oxide layers 225 and 226 may be formed by high temperature deposition to form a HTO (high temperature oxide deposition) layer.

Next, also referring to FIG. 6 a first conductive layer 240 is formed by CVD, for example, on the oxides 225 and 226 and fills the active trenches 210, the termination trench 220 and the trench cells 211 and mesas 214, 215 and 216. The first conductive layer 240 has a thickness such that it extends over mesas 215 and 216. The first conductive layer 240 may be any suitable material such as a metal, doped-polysilicon or doped-amorphous silicon. The first conductive layer 240 may have a thickness of about 0.5 to 3.0 microns. In order to prevent voids from forming in the inner portion of the trenches 210, the first conductive layer 240 may be polysilicon formed by an LPCVD (low pressure CVD) process, which has good step coverage. However, in some cases amorphous silicon may be better able to eliminate voids than polysilicon. To make the amorphous silicon conductive a recrystallization process may be employed.

Figure 7:
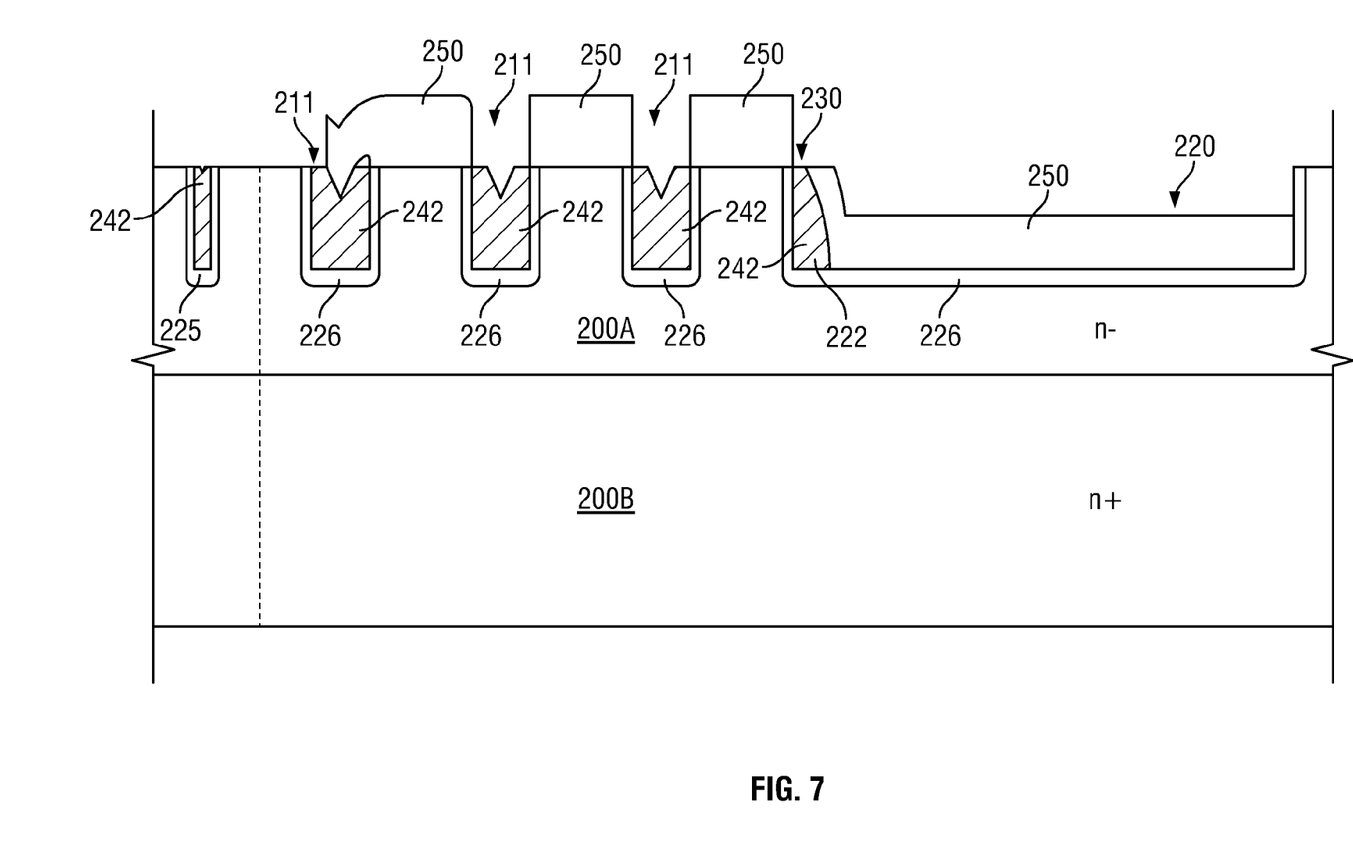

Referring now to FIG. 7 an anisotropic etching is performed to remove the excess first conductive layer 240. During this etching process, the conductive material is removed from the termination trench 220 except for a conductive spacer 242, which is formed on the termination oxide layer 226 lining the sidewall of the termination trench 220 nearest the trench cells 211. In some examples the conductive spacer 242 has a width (along the cross-sectional view that is shown) that is about equal to the height of the termination trench 220.

A dielectric layer 250 is next formed in the termination region using an etching process. The dielectric layer 250 may be, for example, a TEOS layer such as an LPTEOS or PETEOS layer or an $O_3$-TEOS or HTO layer. In some examples the thickness of the dielectric layer 250 may be between about 0.2-1.0 micron. The dielectric layer 250 covers a portion of the trench cell 211 nearest the active region and the portions of the first layer 210A between the trench cells 211 (i.e., mesas 215) and between the termination trench 120 and the trench cells 211 (i.e., mesa 216). The dielectric layer 250 also covers the termination trench 220 and contacts a sidewall of the conductive spacer 242. However, a topmost surface 230 of the conductive spacer 242 remains exposed.

Figure 8:
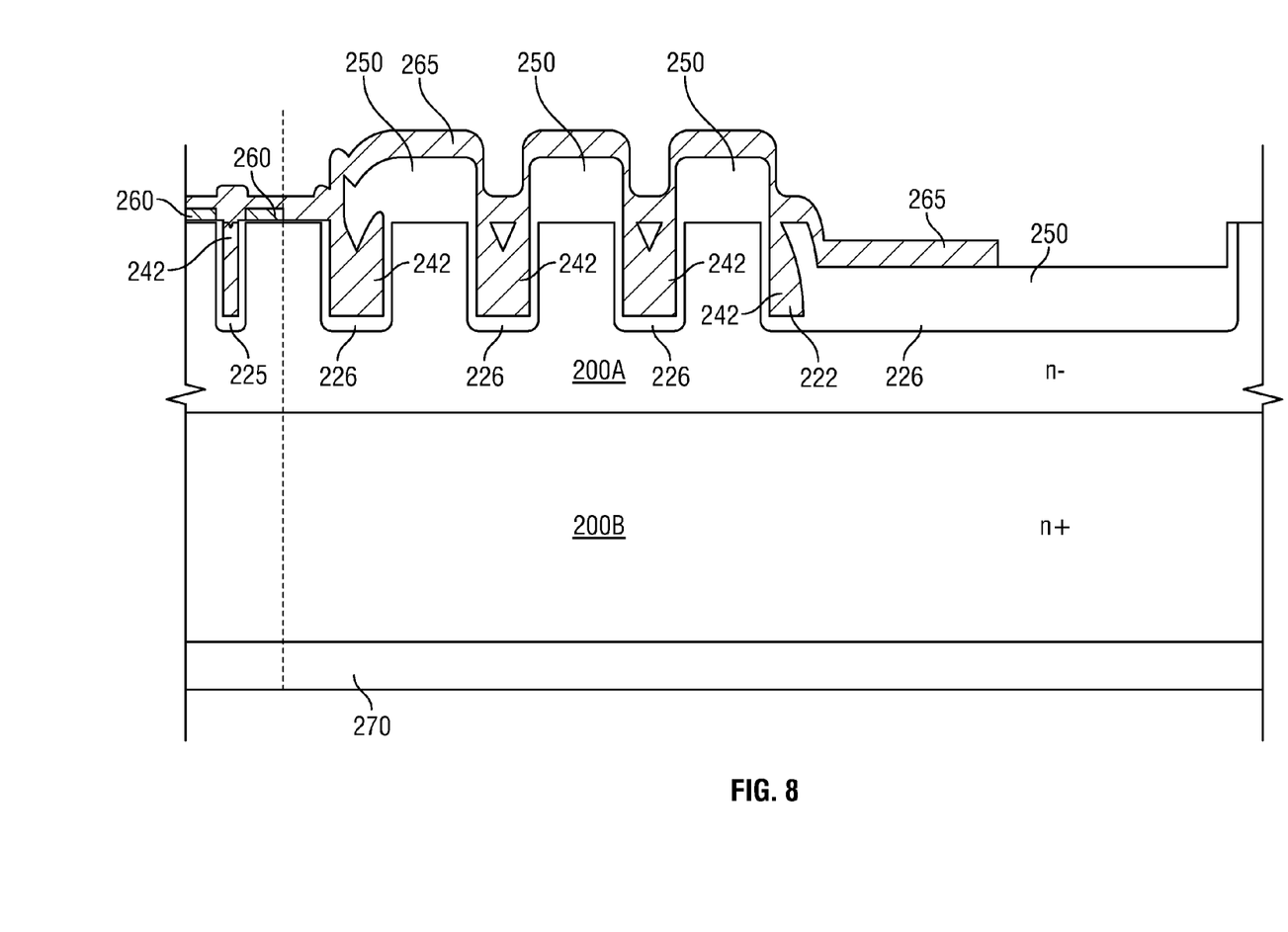

Next, in FIG. 8 a sputtering or other suitable process is performed to deposit a second conductive layer 165 over the entire structure so as to form Schottky contact regions 260 on mesas 114. The second conductive layer 165 may be formed from any material that can form a Schottky diode with the underlying first layer 100A. For example, second conductive layer 165 may be a metal silicide layer. Finally, a cathode electrode 170 is deposited on the backside of substrate 100B.

Example

By way of illustration, various structural dimensions and parameters will be specified for one particular embodiment of the invention that includes four trench cells. In this embodiment the termination trench 120 has a width ranging from 10-50 microns and a depth that may be the same or different from the depth of the trenches 110 in the active region. Depending on the particular design and desired device characteristics (e.g., voltage capability, speed, leakage current) the depth of the termination trench 120 may range from 0.5-10 microns. The dielectric layer 150 located in the termination trench 120 may be silicon dioxide layer having a thickness between about 1500-15,000 angstroms, depending on the blocking voltage that is required and the composition of the material.

The trench cells may have a width between 0.2 and 2.0 microns and a depth between 0.5 and 10 microns. The width and depth of the trench cells may be the same or different from one another. The field plate defined by the extension of conductive layers 165 into the termination region may have a length between about 5 and 50 microns in the termination trench 120.

The MFRT termination structure described herein provides a number of benefits. For example, by redistributing the electric field under the termination structure the conductive spacer will not be a critical point affecting the breakdown voltage of the device. As a result the breakdown voltage sustaining capability of the termination structure will be similar to the breakdown voltage sustaining capability of the active region. Moreover, if there any control problems during the wet metal etching process that may be employed to form the field plate, the electric field under the conductive spacer and the distal end of the field plate can still be maintained at an acceptable level and will not affect the breakdown voltage.

It should be noted that the MFRT termination structure described herein may be used in connection with devices other than TMBS diodes, which has been presented by way of illustration only. For example, the termination structure can be applied to any power transistor such as a doubled diffused metal-oxide-semiconductor field effect transistor (DMOS-FET), an insulated gate bipolar transistor (IGBT) and other trench MOS devices.

It will be understood that spatially relative terms, such as "top," "bottom," "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an above and below orientation.

Although various embodiments are specifically illustrated and described herein, it will be appreciated that modifications and variations of the present invention are covered by the above teachings and are within the purview of the appended claims without departing from the spirit and intended scope of the invention.

The invention claimed is:

1. A termination structure for a semiconductor device, said termination structure comprising:
   a semiconductor substrate having an active region and a termination region;
   a plurality of trench cells located only in the termination region and extending from a boundary of the active region toward an edge of the semiconductor substrate;
   a termination trench formed in the termination region on a side of the plurality of trench cells remote from the active region;
   a conductive spacer located adjacent a sidewall of the termination trench nearest the plurality of trench cells;
   a first oxide layer formed in the termination trench and contacting a sidewall of the conductive spacer;
   a first conductive layer formed on a backside surface of the semiconductor substrate;
   a second conductive layer formed atop the active region and the termination region wherein the plurality of trench cells are filled with a conductive material up to a top surface of a plurality of mesas;
   wherein the second conductive layer extends from the active area as a continuous layer and completely covering the plurality of trench cells and at least a portion of the termination trench such that the second conductive layer, the conductive spacer and a field plate formed in the termination region are electrically coupled to one another.

2. The termination structure of claim 1, further comprising a second oxide layer lining sidewalls and a bottom surface of the trench cells and the termination trench, the conductive spacer being in contact with the second oxide layer on a sidewall and bottom surface of the termination trench.

3. The termination structure of claim 2, further comprising a third oxide layer located on the mesas disposed between adjacent trench cells and being further located between the second conductive layer and the semiconductor substrate.

4. The termination structure of claim 3, wherein said Schottky diode is a TMBS Schottky diode that includes at least one trench in the active region of the substrate.

5. The termination structure of claim 1, wherein said semiconductor device is a Schottky diode.

6. The termination structure of claim 1, wherein said termination structure is employed in a device selected from the group consisting of power transistors and rectifiers.

7. A semiconductor device, comprising:
   a semiconductor substrate having at least one trench MOS device located in an active region of the semiconductor substrate;
   a plurality of trench cells only located in a termination region of the semiconductor substrate adjacent to the active region of the semiconductor substrate, the plurality of trench cells extending from a boundary between the active and termination regions toward an edge of the semiconductor substrate;
   a termination trench formed in the termination region on a side of the plurality of trench cells remote from the active region;
   a first oxide layer lining the plurality of trench cells and the termination trench;
   a conductive spacer located adjacent a sidewall of the termination trench nearest the plurality of trench cells;
   a second oxide layer formed in the termination trench and contacting a sidewall of the conductive spacer;
   a first conductive layer formed on a backside surface of the semiconductor substrate; and a second conductive layer located atop the active region and the termination region, a portion of the second conductive layer located in the termination region defining a field plate.

8. The semiconductor device of claim 7, wherein said semiconductor substrate comprises a first layer and a base substrate, and said first layer has a first type of conductive impurities lightly doped and said base substrate has said first type of conductive impurities heavily doped.

9. The semiconductor device of claim 7, wherein said trench MOS devices and said termination trench are formed in said first layer and have a depth of between about 0.5-10.0 microns.

10. The semiconductor device of claim 7, wherein said termination trench has a width between about 10-50 microns.

11. The semiconductor device of claim 7, further comprising a third oxide layer located on mesas disposed between adjacent trench cells and being further located between the second conductive layer and the semiconductor substrate.

12. The semiconductor device of claim 7, wherein said semiconductor device is a Schottky diode.

13. The semiconductor device of claim 12, wherein said Schottky diode is a TMBS Schottky diode that includes at least one trench in the active region of the substrate.

14. The semiconductor device of claim 7 wherein said trench cells are filled with a conductive material.

15. The semiconductor device of claim 7 wherein the second conductive layer extends as a continuous layer that extends into the trench cells and at least a portion of the termination trench such that the second conductive layer and the conductive spacer are electrically coupled to one another.

16. The semiconductor device of claim 7, wherein said termination structure is employed in a device selected from the group consisting of power transistors and rectifiers.

17. A method of forming a semiconductor device, comprising:

forming at least one trench MOS device located in an active region of a semiconductor substrate, forming a plurality of trench cells located in a termination region of the semiconductor substrate adjacent to the active region of the semiconductor substrate, the plurality of trench cells extending from a boundary between the active and termination regions toward an edge of the semiconductor substrate, forming a termination trench in the termination region of the semiconductor substrate on a side of the plurality of trench cells remote from the active region, forming a conductive spacer located adjacent a sidewall of the termination trench nearest the plurality of trench cells, forming a first oxide layer in the termination trench which contacts a sidewall of the conductive spacer, forming a first conductive layer on a backside surface of the semiconductor substrate, forming a second conductive layer located atop the active region; and forming a first conductive layer on a backside surface of the semiconductor substrate, wherein the plurality of trench cells are filled with a conductive material up to a top surface of a plurality of mesas, wherein the second conductive layer extends from the active area as a continuous layer and completely covering the plurality of trench cells and at least a portion of the termination trench such that the second conductive layer, the conductive spacer and a field plate formed in the termination region are electrically coupled to one another.

18. The method of claim 17 wherein forming the field plate includes forming an extension of the second conductive layer into the termination trench.

* * * * *